United States Patent
Ohkawa et al.

(10) Patent No.: US 10,266,063 B2
(45) Date of Patent: *Apr. 23, 2019

(54) BATTERY CONTROLLER AND VEHICLE SYSTEM

(71) Applicant: HITACHI AUTOMOTIVE SYSTEMS, LTD., Ibaraki (JP)

(72) Inventors: Keiichiro Ohkawa, Hitachinaka (JP); Ryohhei Nakao, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/555,126

(22) PCT Filed: Feb. 26, 2016

(86) PCT No.: PCT/JP2016/055744
§ 371 (c)(1),
(2) Date: Sep. 1, 2017

(87) PCT Pub. No.: WO2016/140152
PCT Pub. Date: Sep. 9, 2016

(65) Prior Publication Data
US 2018/0037130 A1    Feb. 8, 2018

(30) Foreign Application Priority Data
Mar. 2, 2015 (JP) .................. 2015-039997

(51) Int. Cl.
H02J 7/00      (2006.01)
B60L 11/18     (2006.01)
(Continued)

(52) U.S. Cl.
CPC .......... B60L 11/1861 (2013.01); B60L 11/08 (2013.01); B60L 11/14 (2013.01); B60L 11/1857 (2013.01);
(Continued)

(58) Field of Classification Search
CPC ..................................................... Y02E 60/12
(Continued)

(56) References Cited

U.S. PATENT DOCUMENTS 6,018,694 A * 1/2000 Egami ...................... B60K 6/24
                                                    180/65.23
7,017,061 B2 * 3/2006 Lippert .................... G06F 1/30
                                                    713/320
(Continued)

FOREIGN PATENT DOCUMENTS

EP      2762909 A2      8/2014
JP      2005-083970 A   3/2005
(Continued)

OTHER PUBLICATIONS

International Search Report for WO 2016/140152 A1, dated May 17, 2016.
(Continued)

*Primary Examiner* — Yalkew Fantu
(74) *Attorney, Agent, or Firm* — Volpe and Koenig, P.C.

(57) ABSTRACT

A battery controller capable of increasing the number of chances of being able to acquire information on a secondary battery storage capacity and a vehicle system having the battery controller mounted thereon are provided. A battery controller 120 mounted on a vehicle system 200 includes a time point setting unit 153 that sets a first time point at which a first voltage difference dVa (=CCVa−OCVa) which is a difference obtained by subtracting a first open-circuit voltage OCVa from a first closed-circuit voltage CCVa is
(Continued)

obtained and a second time point at which a second voltage difference dVb (=CCVb−OCVb) which is a difference obtained by subtracting a second open-circuit voltage OCVb from a second closed-circuit voltage CCVb is obtained and an absolute value of the difference from the first voltage difference dVa is equal to or smaller than a predetermined value.

16 Claims, 8 Drawing Sheets

(51) Int. Cl.
  *B60L 11/14*   (2006.01)
  *G01R 31/36*   (2019.01)
  *H01M 10/44*   (2006.01)
  *H01M 10/48*   (2006.01)
  *B60W 20/50*   (2016.01)
  *B60L 11/08*   (2006.01)
(52) U.S. Cl.
  CPC ............ *B60W 20/50* (2013.01); *G01R 31/36* (2013.01); *G01R 31/3624* (2013.01); *H01M 10/44* (2013.01); *H01M 10/48* (2013.01); *H02J 7/00* (2013.01); *B60L 2240/547* (2013.01); *B60L 2240/549* (2013.01); *B60L 2260/42* (2013.01); *Y02T 10/70* (2013.01); *Y02T 10/705* (2013.01); *Y02T 10/7005* (2013.01); *Y02T 10/7077* (2013.01)
(58) Field of Classification Search
  USPC ........................................................ 320/132
  See application file for complete search history.

(56) References Cited

U.S. PATENT DOCUMENTS

| | | | |
|---|---|---|---|
| 8,581,554 B2* | 11/2013 | Saligram | H02J 7/0078 320/132 |
| 2008/0178032 A1* | 7/2008 | Walrath | G06F 1/3287 713/340 |
| 2008/0238371 A1 | 10/2008 | Tamezane | |
| 2010/0205472 A1* | 8/2010 | Tupman | G06F 1/3203 713/340 |
| 2012/0306450 A1* | 12/2012 | Nakayama | G06F 1/263 320/134 |
| 2014/0195826 A1* | 7/2014 | Wojcik | H05K 5/0086 713/300 |
| 2015/0301115 A1* | 10/2015 | Ohkawa | H02J 7/0077 324/429 |
| 2015/0346285 A1 | 12/2015 | Igarashi et al. | |

FOREIGN PATENT DOCUMENTS

| | | |
|---|---|---|
| JP | 2008-241358 A | 10/2008 |
| JP | 2012-058028 A | 3/2012 |
| WO | 2014/027389 A1 | 2/2014 |
| WO | 2014/132403 A1 | 9/2014 |
| WO | 2014/147899 A1 | 9/2014 |

OTHER PUBLICATIONS

Extended European Search Report dated Sep. 12, 2018 for the European Patent Application No. 16758846.6.

\* cited by examiner

BATTERY CONTROLLER AND VEHICLE SYSTEM

TECHNICAL FIELD

The present invention relates to a battery controller and a vehicle system having the battery controller mounted thereon.

BACKGROUND ART

Secondary batteries such as a lead-acid battery, a nickel-hydrogen battery, or a lithium-ion battery are mounted in a vehicle that travels using electricity as motive power. Electric power required when a hybrid automobile or an electric automobile travels is supplied from these secondary batteries.

Secondary batteries experience capacity deterioration due to aging (that is, the storage capacity decreases). SOH (State of Health, deterioration state) of a secondary battery is an index of the capacity deterioration. PTL 1 discloses the following method of calculating battery capacity after deterioration. Two time points at which open-circuit voltages are obtained are selected, and SOCs (State of Charge, charge rate, charge state) and a SOC difference are calculated from the open-circuit voltages. The battery capacity after deterioration is obtained by dividing a time integrated value of a charge and discharge current in a period defined by the two time points by the SOC difference. The two time points are a predetermined time point after an ignition-ON point and a predetermined time point after an ignition-OFF point. A capacity maintenance rate (SOHQ) which is one of SOH indices can be calculated by dividing a secondary battery storage capacity obtained by the invention disclosed in PTL 1 by an initial secondary battery storage capacity.

CITATION LIST

Patent Literature

PTL 1: Japanese Unexamined Patent Application Publication No. 2008-241358

SUMMARY OF INVENTION

Technical Problem

However, in the invention disclosed in PTL 1, since there are a small number of chances to obtain the two time points, the number of chances of being able to acquire information on a secondary battery storage capacity is also small.

Solution to Problem (1) A battery controller according to a preferable aspect of the present invention includes: a closed-circuit voltage detection unit that measures a terminal-to-terminal voltage of a secondary battery to acquire a closed-circuit voltage; an open-circuit voltage calculation unit that performs calculation on the basis of the closed-circuit voltage to acquire an open-circuit voltage; a time point setting unit that calculates a voltage difference obtained by subtracting the open-circuit voltage from the closed-circuit voltage and sets a first time point and a second time point at which an absolute value of the voltage difference is equal to or smaller than a predetermined value; a cumulative current amount calculation unit that obtains a cumulative current amount which is a time integrated value of a current flowing through the secondary battery in a period between the first time point and the second time point; a SOC difference calculation unit that calculates a difference between SOC at the first time point and SOC at the second time point; and a storage capacity calculation unit that divides the cumulative current amount by the SOC difference to calculate a storage capacity of the secondary battery.

(2) A vehicle system according to a preferable aspect of the present invention includes: the battery controller according to a preferable aspect of the present invention; a motor generator that is driven by electric power from the secondary battery during a powering mode and generates regenerative power that charges the secondary battery in a regeneration mode; and a system control unit that controls at least the motor generator.

Advantageous Effects of Invention

According to the present invention, it is possible to increase the number of chances of being able to acquire information on the secondary battery storage capacity. As a result, it is possible to increase the number of chances to calculate a capacity maintenance rate (SOHQ).

DESCRIPTION OF EMBODIMENTS

First Embodiment

Figure 1:
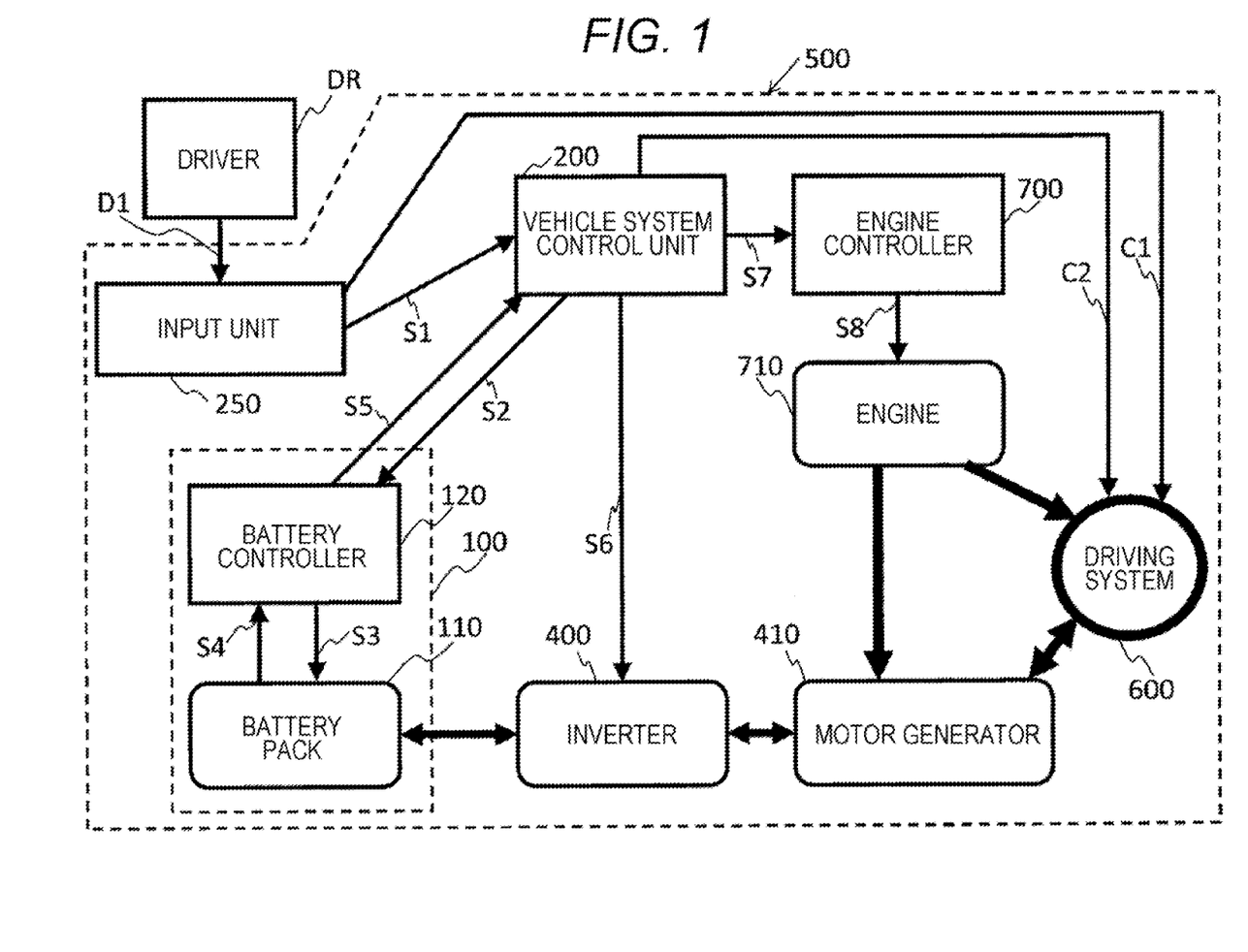
FIG. 1 is a diagram illustrating a vehicle system.

FIG. 1 is a diagram illustrating a vehicle system 500 of the present embodiment. The vehicle system 500 is a so-called parallel hybrid system. The vehicle system 500 includes a driving system 600, an engine 710, an engine controller 700, a motor generator 410, an inverter 400, a battery system 100 having a battery pack 110 and a battery controller 120, an input unit 250, and a vehicle system control unit 200.

The input unit 250 is a unit with which a driver DR illustrated in FIG. 1 inputs an operation command directly to the vehicle system. The input unit 250 includes an accelerator pedal, a brake pedal, a steering wheel, an input device or the like for starting or stopping the vehicle system 500. When an operation command D1 is input from the driver DR, the input unit 250 outputs a signal S1 corresponding to the operation command D1 to the vehicle system control unit 200. The signal S1 is output when the operation command is input particularly to an accelerator pedal and a brake pedal among the constituent parts of the input unit 250.

The vehicle system control unit 200 controls the engine controller 700, the battery controller 120, the inverter 400, and the like on the basis of the signal S1 output from the input unit 250. For this control, the vehicle system control unit 200 outputs a signal S2 to the battery controller 120, outputs a signal S6 to the inverter 400, and outputs a signal S7 to the engine controller 700. The vehicle system control unit 200 determines distribution of motive power that the motor generator 410 outputs to the driving system 600 and motive power that the engine 710 outputs to the driving system 600 according to a driving state or the like. The battery controller 120 may output a command signal S5 to the vehicle system control unit 200 to control the engine controller 700, the battery controller 120, the inverter 400, and the like.

The battery system 100 includes the battery pack 110 that includes unit cells 111 (FIG. 2) which are secondary batteries and the battery controller 120. During a powering mode of the motor generator 410, the battery pack 110 is discharged to supply electric power to the motor generator 410 via the inverter 400. Moreover, during a regeneration mode of the motor generator 410, the battery pack 110 is charged via the inverter 400 using the electric power output from the motor generator 410. The details of the configuration of the battery system 100 will be described later. The battery controller 120 performs various control operations (signal S3) on the battery pack 110 on the basis of the signal S4 including various items of information of the battery pack 110 output from the battery pack 110. The details thereof will be described later.

The inverter 400 is provided between the battery pack 110 and the motor generator 410 and controls current flowing between the battery pack 110 and the motor generator 410 on the basis of the signal S6.

The motor generator 410 converts electrical energy from the battery pack 110 to mechanical energy and outputs the energy to the driving system 600. As described above, since the vehicle system 500 is a parallel hybrid system, the motor generator 410 converts mechanical energy from the driving system 600 or the engine 710 to electrical energy and outputs the energy to the battery pack 110. The mechanical energy is supplied from the driving system 600 to the motor generator 410, for example, when the driver DR steps on a brake pedal of the input unit 250 to stop the driving system 600. The mechanical energy is supplied from the engine 710 to the motor generator 410, for example, when the SOC of the battery pack 110 is lower than a predetermined range and the battery pack 110 is controlled so that the SOC falls within the predetermined range. Specifically, the battery controller 120 monitors the SOC of the battery pack 110, and when judging that the SOC is lower than the predetermined range, the battery controller 120 controls the engine controller 700 with the aid of the vehicle system control unit 200 and supplies mechanical energy from the engine 710 to the motor generator 410.

The engine controller 700 outputs a signal S8 to the engine 710 on the basis of the signal S7 from the vehicle system control unit 200 and controls the engine 710.

The engine 710 performs ignition, pumping, and valve operations, and the like on the basis of the signal S8. In this way, the engine 710 can obtain mechanical energy (that is, motive power). The obtained motive power is output to the driving system 600 or the motor generator 410.

The driving system 600 includes wheels, a drive shaft, a propeller shaft, a differential gear, a hydraulic brake, and the like, which are not illustrated in the drawing. The driving system 600 drives respective constituent parts of the driving system 600 using the motive power from the motor generator 410 and the motive power from the engine 710 and drives and controls the vehicle.

An input path of the operation command D1 from the input unit 250 to the driving system 600 is not limited to the path that passes through the engine 710 or the motor generator 410. As another input path, a path C1 in which the operation command is input directly from the input unit 250 to the driving system 600 (for example, an input path from a brake pedal to a hydraulic brake) may be used. Moreover, a path C2 in which, after the operation command D1 is input from the input unit 250 to the vehicle system control unit 200, the operation command is input directly from the vehicle system control unit 200 to the driving system 600 via another control system such as an electric power steering system may be used. However, since this input path is not related to the battery system 100 of the present embodiment, the description thereof will be omitted.

Figure 2:
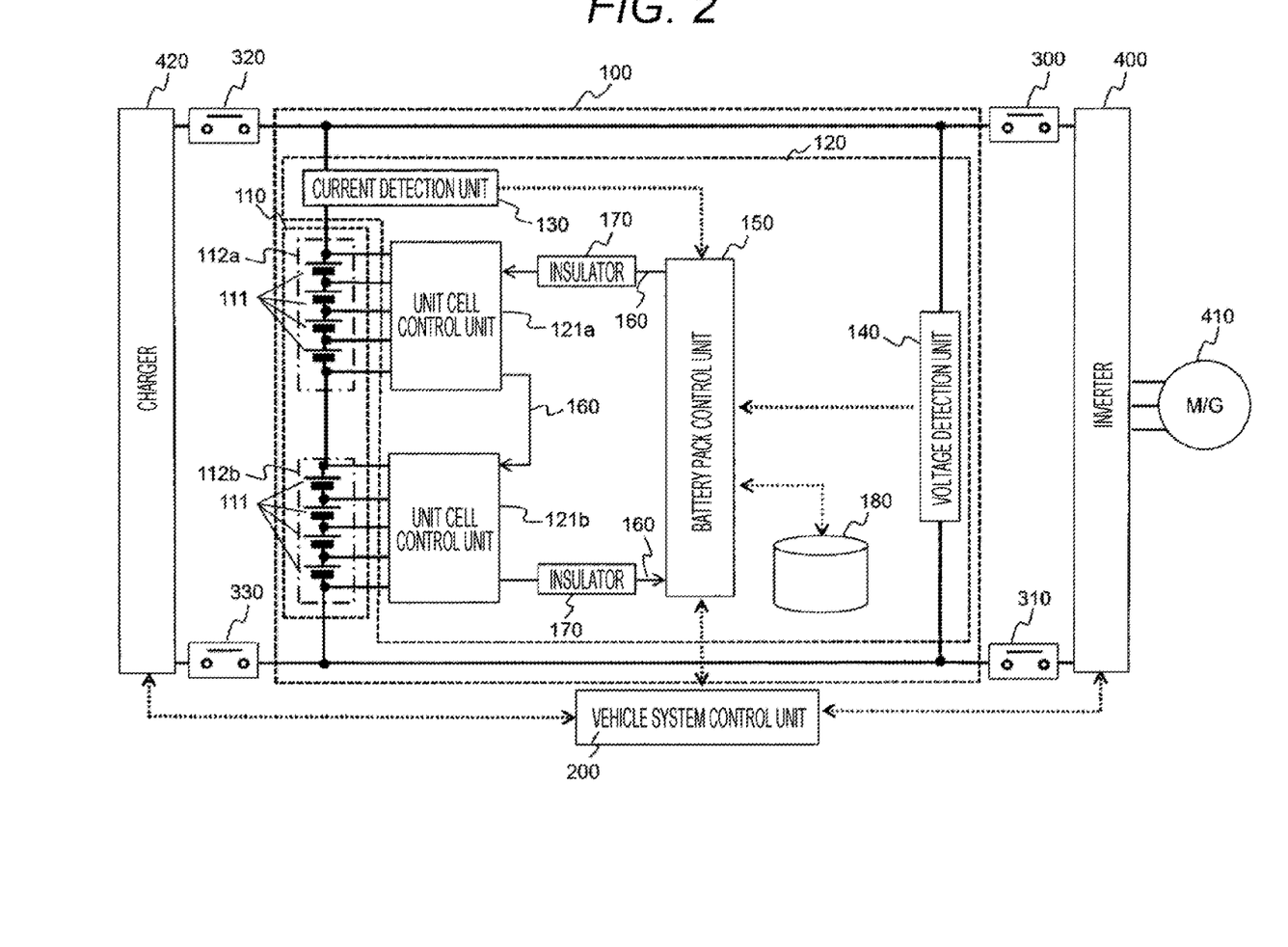
FIG. 2 is a diagram illustrating a battery controller and a peripheral configuration thereof.

FIG. 2 is a diagram illustrating the battery system 100 including the battery controller 120 and the peripheral configuration thereof. The battery system 100 is connected to the inverter 400 via relays 300 and 310. The battery system 100 includes the battery pack 110 and the battery controller 120. The battery controller 120 includes unit cell control units 121a and 121b, a current detection unit 130, a voltage detection unit 140, a battery pack control unit 150, and a storage unit 180.

The battery pack 110 is configured such that a plurality of unit cells 111 capable of storing and discharging electric energy (charging and discharging direct-current electric power) are electrically connected in series. The unit cells 111 that form the battery pack 110 are grouped into predetermined unit numbers so that the state is managed and controlled in respective groups. The grouped unit cells 111 are electrically connected in series to form unit cell groups 112. The battery pack 110 of the present embodiment includes a plurality of unit cell groups 112 (that is, unit cell groups 112a and 112b). The number of unit cells 111 that form the unit cell group 112 may be the same for all unit cell groups 112 and the number of unit cells 111 may be different in respective unit cell groups 112. In the present embodiment, for simple description, as illustrated in FIG. 2, four unit cells 111 are electrically connected in series to form unit cell groups 112a and 112b, and these unit cell groups 112a and 112b are electrically connected in series so that eight unit cells 111 in total are included in the battery pack 110.

The unit cell control units 121a and 121b are connected to the unit cell groups 112a and 112b, respectively, so as to detect a battery voltage (open-circuit voltage) and the temperature of each of the unit cells 111 that form the unit cell groups and transmits a signal indicating the detection result to the battery pack control unit 150 via a signal communication line 160 and an insulation element 170. A photocoupler is used as the insulation element 170, for example.

The current detection unit 130 detects current flowing through the battery pack 110. The voltage detection unit 140 detects an open-circuit voltage of the battery pack 110 (that is, a total voltage of the serially connected unit cells 111 of the battery pack 110).

The battery pack control unit 150 executes various processes and calculations for controlling the battery pack 110 using items of information received from the unit cell control units 121a and 121b, the current detection unit 130, the voltage detection unit 140, and the vehicle system control unit 200, the information stored in the storage unit 180, and the like. For example, the battery pack control unit 150 calculates a SOC, a storage capacity, and SOHQ of each unit cell 111. The details thereof will be described later with reference to FIG. 4. Moreover, the battery pack control unit 150 outputs information necessary for control of the battery pack 110 to the unit cell control units 121a and 121b and the vehicle system control unit 200 on the basis of these calculation results.

Here, a communication method between the battery pack control unit 150 and the unit cell control units 121a and 121b will be described. The unit cell control units 121a and 121b are connected in series in descending order of potentials of the unit cell groups 112a and 112b that the unit cell control units monitor. A signal transmitted from the battery pack control unit 150 is input to the unit cell control unit 121a via the insulation element 170 and the signal communication line 160. The output of the unit cell control unit 121a is input to the unit cell control unit 121b via the signal communication line 160. The output of the unit cell control unit 121b on the lowest rank is transmitted to the battery pack control unit 150 via the insulation element 170 and the signal communication line 160. In the present embodiment, although an insulation element is not provided between the unit cell control unit 121a and the unit cell control unit 121b, signals may be transmitted and received between the unit cell control units via the insulation element.

Various items of information necessary for the battery pack control unit 150 to control the battery pack 110 are stored in the storage unit 180. For example, information on the SOC of each unit cell 111, information on an initial storage capacity of each of brand-new unit cells 111, and the like are stored in the storage unit 180. The details of these items of information will be described later again, and examples thereof include an internal resistance Ro, a capacitance C, and an internal resistance Rp.

The vehicle system control unit 200 controls the inverter 400 connected to the battery system 100 via the relays 300 and 310 using the information transmitted from the battery pack control unit 150. During travelling of the vehicle, the battery system 100 is connected to the inverter 400. The inverter 400 drives the motor generator 410 using the electrical energy stored in the battery pack 110 of the battery system 100.

When the vehicle system 500 having the battery system 100 mounted thereon is started and the vehicle travels, the battery system 100 is connected to the inverter 400 under the control of the vehicle system control unit 200. The motor generator 410 is driven by the inverter 400 using the energy stored in the battery pack 110. On the other hand, in a regeneration mode, the battery pack 110 is charged by the electric power generated by the motor generator 410.

When the battery system 100 is connected to a charger 420 via the relays 320 and 330, the battery pack 110 is charged by a charge current supplied from the charger 420 until the battery pack 110 satisfies a predetermined condition. The energy stored in the battery pack 110 by charging is used for operating electric components inside and outside the vehicle as well as being used during the next travelling of the vehicle. Furthermore, the energy may be sometimes discharged to an external power supply represented by a domestic power supply as necessary. The charger 420 may be an in-vehicle charger mounted on a vehicle and may be mounted on an external power supply represented by a charging stand. When the vehicle having the battery system 100 mounted thereon is connected to these power supplies, the battery system 100 and the charger 420 are connected on the basis of the information transmitted by the vehicle system control unit 200.

Figure 3:
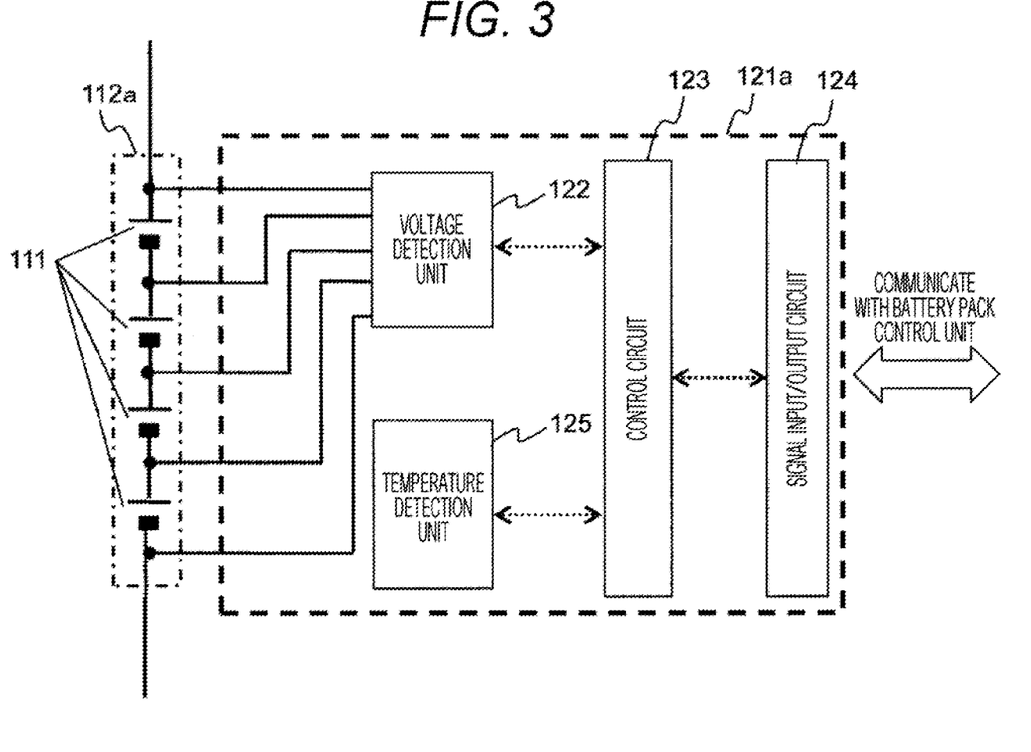
FIG. 3 is a diagram illustrating a unit cell and a unit cell control unit.

FIG. 3 is a diagram illustrating a circuit configuration of the unit cell control unit 121a. As illustrated in FIG. 3, the unit cell control unit 121a includes a voltage detection unit 122, a control circuit 123, a signal input/output circuit 124, and a temperature detection unit 125. The unit cell control units 121a and 121b in FIG. 2 have the same circuit configuration. Due to this, FIG. 3 illustrates the circuit configuration of the unit cell control unit 121a as a representative example of these unit cell control units.

The voltage detection unit 122 measures a terminal-to-terminal voltage (open-circuit voltage) of each unit cell 111. The control circuit 123 receives measurement results from the voltage detection unit 122 and the temperature detection unit 125 and transmits the measurement results to the battery pack control unit 150 via the signal input/output circuit 124. Although not illustrated in FIG. 3, an existing circuit configuration for equalizing a variation in the voltage and the SOC among unit cells 111 occurring due to a variation in self-discharge and current consumption is also provided in the unit cell control unit 121a. The operation this circuit is controlled by the control circuit 123.

In FIG. 3, the temperature detection unit 125 has a function of measuring the temperature of the unit cell group 112a. The temperature detection unit 125 measures one temperature for the entire unit cell group 112a and handles the temperature as a representative value of the temperatures of the respective unit cells 111 that form the unit cell group 112a. The temperature measurement result obtained by the temperature detection unit 125 is used when the battery pack control unit 150 performs various operations for detecting the state of the unit cell 111, the unit cell group 112a, and the battery pack 110. In this case, the temperature measured by the temperature detection unit 125 is handled as the temperature of each unit cell 111 of the unit cell group 112a as well as the temperature of the unit cell group 112a. Furthermore, the battery pack control unit 150 may calculate the temperature of the battery pack 110 on the basis of the temperature of the unit cell group 112a measured by the temperature detection unit 125 of the unit cell control unit 121a and the temperature of the unit cell group 112b measured by the temperature detection unit 125 of the unit cell control unit 121b by averaging the temperatures, for example.

FIG. 3 illustrates an example in which one temperature detection unit 125 is provided in the unit cell control unit 121a. Beside this, the temperature detection unit 125 may be provided in respective unit cells 111 to measure the temperatures of the respective unit cells 111, and the battery pack control unit 150 may execute various operations on the basis of the measurement result. Alternatively, one temperature detection unit 125 may be provided in the entire battery pack 110.

Although the temperature detection unit 125 is depicted as one block in FIG. 3 for the simplicity sake, a temperature sensor is provided in the unit cell group 112a which is a temperature measurement target and this temperature sensor outputs temperature information as a voltage signal. It is possible to obtain a temperature measurement result of the unit cell group 112a by the control circuit 123 calculating the temperature of the unit cell group 112a on the basis of this voltage signal. When the control circuit 123 transmits the temperature measurement result to the signal input/output circuit 124, the signal input/output circuit 124 outputs the temperature measurement result to the outside of the unit cell control unit 121a. A function for realizing this series of flow is implemented in the unit cell control unit 121a as the temperature detection unit 125. The voltage detection unit 122 may measure the voltage signal output from the temperature sensor.

Here, the relation among a terminal-to-terminal voltage V, a closed-circuit voltage (CCV), and an open-circuit voltage (OCV) of each of the unit cells 111 that form the battery pack 110 of the present embodiment will be described with reference to FIGS. 4 to 6.

Figure 4:
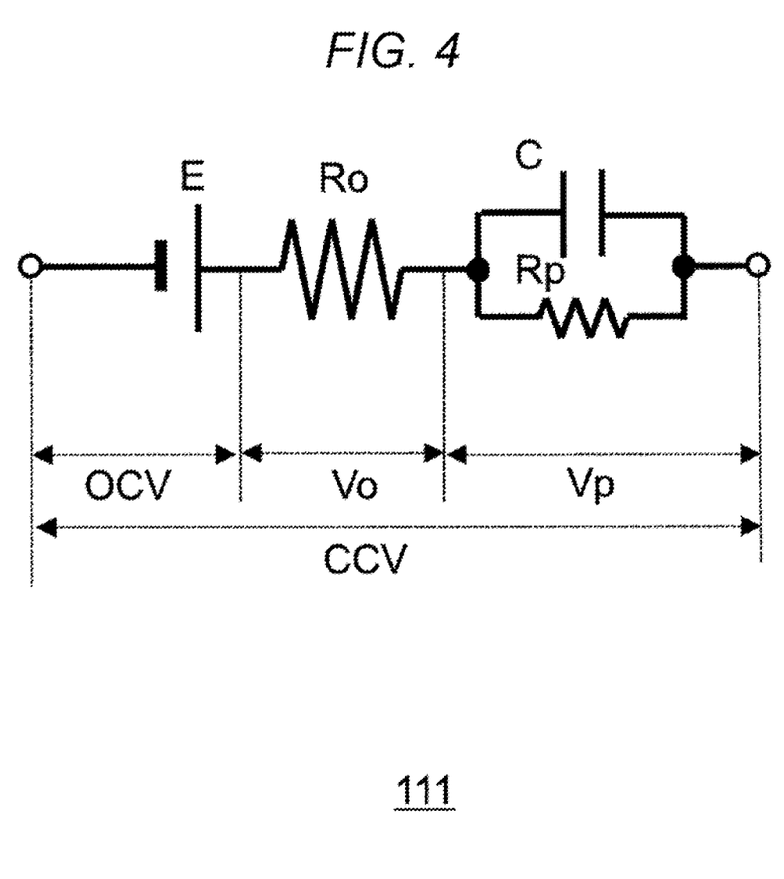
FIG. 4 is a diagram illustrating an equivalent circuit of a secondary battery.

FIG. 4 is a diagram schematically illustrating a configuration of a closed-circuit voltage (CCV) of the unit cell 111. The closed-circuit voltage (CCV) includes an open-circuit voltage (OCV), a voltage Vo, and a voltage Vp. The open-circuit voltage (OCV) originates from electromotive force E of the unit cell 111. The voltage Vo originates from the internal resistance R0 of the unit cell 111. The voltage Vp originates from the capacitance C, the internal resistance Rp, and the like of the unit cell 111. In FIG. 4, a configuration associated with the voltage Vp is depicted as a parallel circuit of the capacitance C and the internal resistance Rp as an example.

FIG. 5(a) illustrates the terminal-to-terminal voltage V of the unit cell 111 when the unit cell 111 is charged. FIG. 5(b) illustrates a charging current I.

In FIGS. 5(a) and 5(b), charging or discharging is not performed before time point t1 and the terminal-to-terminal voltage V is stable. In this case, the terminal-to-terminal voltage V is equal to OCV. Moreover, the voltage Vo and Vp are zero. Due to this, OCV is equal to CCV.

In FIGS. 5(a) and 5(b), a period between time points t1 and t2 is a charging period. A current I starts flowing at the starting time point (that is, t1) of the charging period, and as a result, a voltage Vo (=I·R) is generated. The voltage Vp increases gradually during the charging period. The CCV on the right side of FIG. 5(a) indicates the CCV immediately before the charging period ends.

At time point t2, the charging current I becomes zero and the charging ends. As a result, the voltage Vo (=I·R) becomes zero at time point t2. After time point t2, OCV and the voltage Vp form the CCV. Since charging or discharging does not occur after time point t2, the voltage Vp decays and becomes approximately zero at time point t3.

Figure 5:
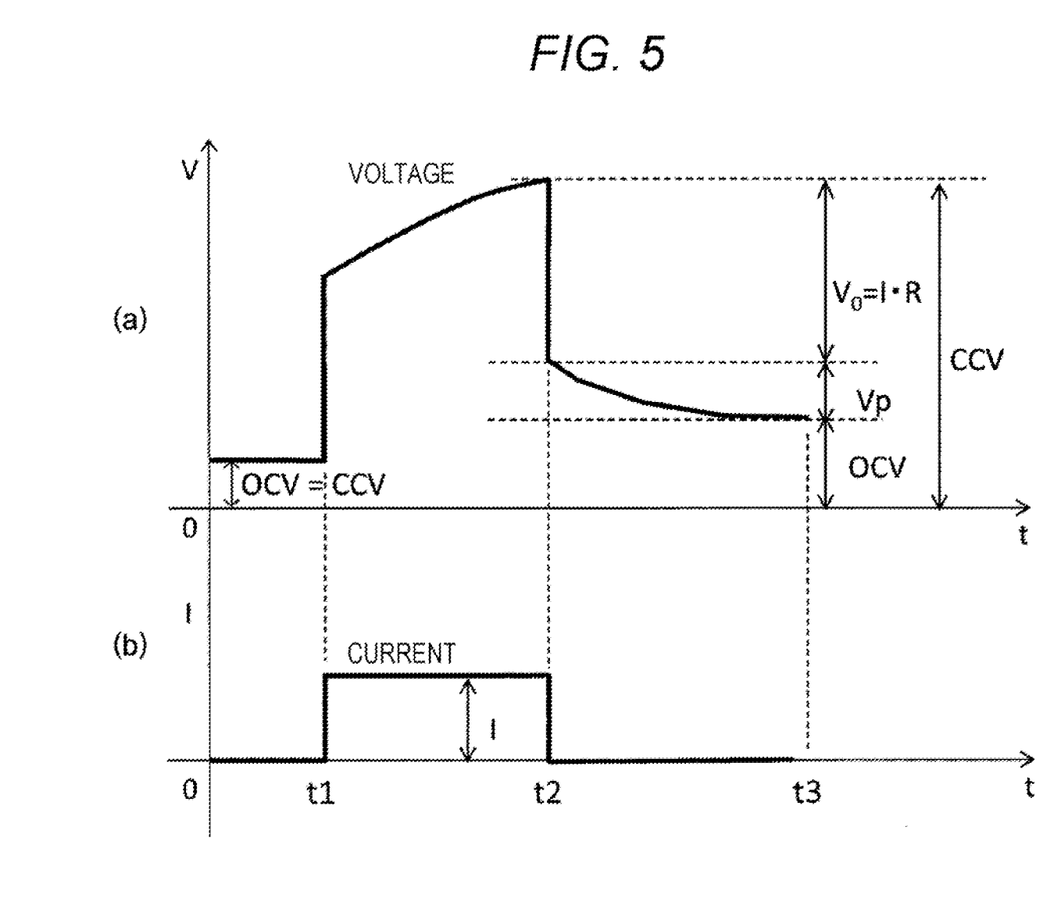
FIGS. 5(a) and 5(b) are diagrams illustrating behavior of a terminal-to-terminal voltage during charging of a secondary battery.

In this manner, the terminal-to-terminal voltage V is finally stabilized after the charging period and a predetermined period (t2 to t3 in FIGS. 5(a) and 5(b)) after charging and becomes equal to the OCV. Although FIGS. 5(a) and 5(b) illustrate the voltages during charging, a similar change occurs during discharging. Since charging and discharging are generally performed substantially without any pause, although the CCV can be detected from the terminal-to-terminal voltage V, it is not possible to detect the OCV. Therefore, the OCV is calculated from an equation which is derived from the relation illustrated in FIGS. 4 to 5(b).

$$OCV = CCV - Vo - Vp \quad (1)$$

When the OCV is calculated from Equation (1), information on the internal resistance Ro, the capacitance C, the internal resistance Rp, the CCV, and the current I is necessary. The details of this calculation will be described later with reference to FIGS. 8(a) and 8(b).

Figure 6:
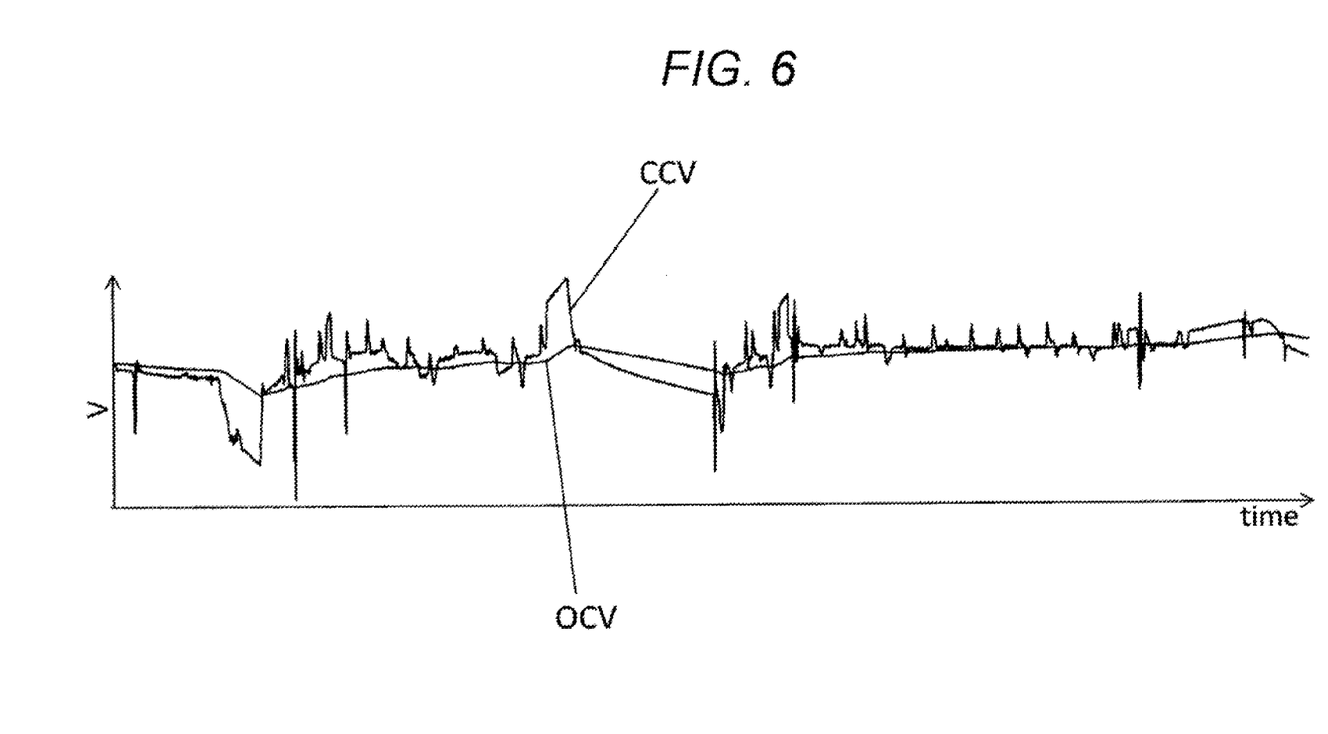
FIG. 6 is a diagram illustrating an example of CCV and OCV.

FIG. 6 illustrates behavior of OCV and CCV which change with charging or discharging. It is understood from FIG. 6 that the OCV and the CCV are not identical to each other.

Figure 7:
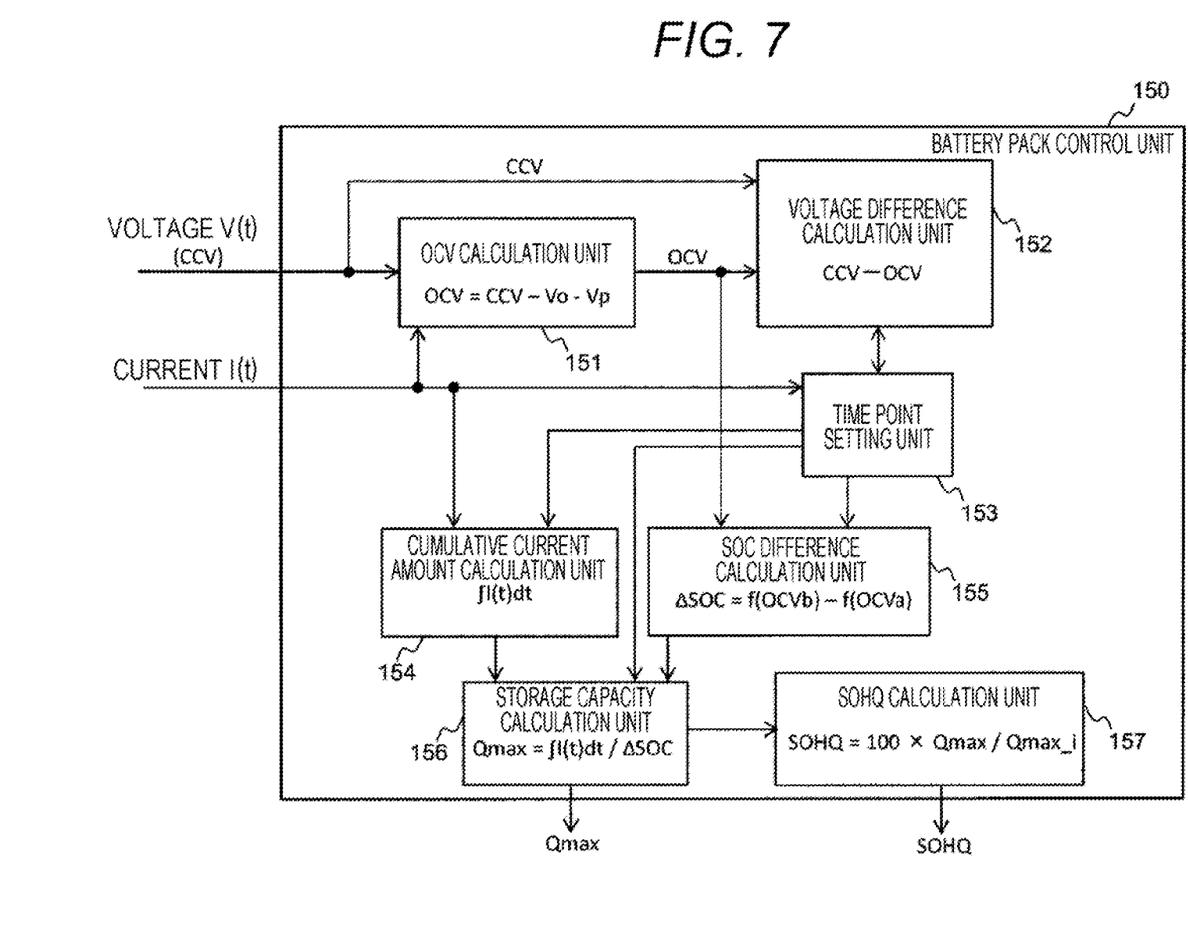
FIG. 7 is a diagram illustrating a battery pack control unit.

FIG. 7 is a functional block diagram illustrating a process of the battery pack control unit 150 calculating various parameters such as a secondary battery storage capacity. The battery pack control unit 150 includes an OCV calculation unit 151, a voltage difference calculation unit 152, a time point setting unit 153, a cumulative current amount calculation unit 154, a SOC difference calculation unit 155, a storage capacity calculation unit 156, and a SOHQ calculation unit 157.

The battery pack control unit 150 obtains information on a current (that is, a charging and discharging current (charging/discharging current) I(t) of each unit cell 111) flowing through the battery pack 110 from the current detection unit 130.

The battery pack control unit 150 obtains information on the terminal-to-terminal voltage of each unit cell 111 from the voltage detection unit 122. As described above, the terminal-to-terminal voltage of each unit cell 111 is equal to the CCV but is generally not equal to the OCV. Due to this, the battery pack control unit 150 handles the voltage V(t) as the CCV as illustrated in on the left side of the drawing.

Although not illustrated in the drawing, the respective constituent parts of the battery pack control unit 150 can obtain necessary information by communicating with the storage unit 180, the unit cell control units 121a and 121b, and the like as necessary.

The OCV calculation unit 151 calculates the OCV on the basis of the voltage V(t) handled as the CCV, the current I(t), the internal resistance Ro, the capacitance C, the internal resistance Rp, and Equation (1)

$$(\text{that is, OCV} = CCV - Vo - Vp \quad (1)).$$

The calculated OCV is output to the voltage difference calculation unit 152 and the SOC difference calculation unit 155. Although not illustrated in the drawing, the OCV calculation unit 151 obtains information on the internal resistance Ro, the capacitance C, and the internal resistance Rp by communicating with the storage unit 180.

The voltage difference calculation unit 152 subtracts the OCV calculated by the OCV calculation unit 151 from the voltage V(t) handled as the CCV to calculate a voltage difference (CCV−OCV), and outputs the voltage difference to the time point setting unit 153 of the time point setting unit 153. Hereinafter, the voltage difference (CCV−OCV) will be denoted by a voltage difference dV.

The time point setting unit 153 sets a time point at which a voltage difference dV among a plurality of voltage differences dV calculated at predetermined time intervals is within a predetermined value range.

Since the number of collectable time points decreases if the time point is set strictly such that "the voltage difference dV is equal to a predetermined value," a time point at which a voltage difference dV that falls within a range of ±α from a predetermined value is calculated may be set. When an absolute value of the difference between the voltage differences dV at two time points at which the voltage differences fall within the range of the predetermined value ±α is calculated, the absolute value is equal to or smaller than the predetermined value (that is, the absolute value is equal to or smaller than a difference obtained by subtracting the lower limit of the predetermined value range from the upper limit). This rule is referred to as Rule 1.

<Rule 1: Set Combination in which Absolute Value of Difference Between Voltage Differences dV is Equal to or Smaller than Predetermined Value>

The time point setting unit 153 sets a combination of first and second time points at which an absolute value |dVb−dVa| of a difference between dVa which is the dV at a certain time point (first time point) and dVb which is the dV at another time point (second time point) is equal to or smaller than the predetermined value. Rule 1 is an essential rule.

The time point setting unit 153 may set the time points using any one of Rules 2 to 6 to be described later in addition to Rule 1. By using Rules 2 to 6 as a rule for setting time points, it is possible to calculate the storage capacity more accurately.

<Rule 2: Set Combination with Large ΔSOC>

$$\text{Storage capacity } Q\text{max}=\int I(t)dt/\Delta SOC \qquad (3)$$

Therefore, when two time points at which the absolute value of ΔSOC is large, the SN ratio of ΔSOC is improved and the accuracy of ΔSOC is improved. As a result, the accuracy of the storage capacity Qmax is also improved. When this rule is used, the time point setting unit 153 calculates ΔSOC by itself. This calculation is similar to the calculation performed by the SOC difference calculation unit 155 to be described later. Furthermore, when this rule is used, the time point setting unit 153 sets a combination of time points at which the absolute value of ΔSOC is equal to or larger than a predetermined value (for example, 5%). Here, the predetermined value may be a constant and may be expressed as a function or a map. For example, when a function which uses a time period between a first time point and a second time point is considered, a function in which the predetermined value is small for a short time period and is large for a long time period may be set. In this case, although the error (integration error) included in the cumulative current amount ∫I(t)dt mentioned in Rule 6 to be described later increases when the time period is long, it is possible to improve the accuracy of the storage capacity Qmax by increasing the absolute value of ΔSOC.

<Rule 3: Setting Combination in which Behavior of Current at First and Second Time Points are Similar>

The OCV calculation unit 151 uses the internal resistances Ro, Rp, and the like of the unit cell 111. Although the internal resistance of a battery changes depending on a temperature condition and the like, the internal resistance also changes depending on the magnitude or the polarity of a current. That is, an error included in the internal resistance also changes depending on the magnitude or the polarity of a current. If current values at a pair of time points are substantially equal as well as the signs thereof, since the behavior of the currents at the respective time points are the same, the errors in the internal resistances are substantially equal. Therefore, even when an error is included in the output of the OCV calculation unit 151, it is possible to reduce (that is, cancel) the error when the SOC difference calculation unit 155 calculates ΔSOC. In this rule, the time point setting unit 153 sets a combination of time points at which an absolute value of the difference obtained by subtracting a current value flowing through a secondary battery at a second time point from a current value flowing through the secondary battery at a first time point is equal to or smaller than a predetermined value.

<Rule 4: Set Combination in which Absolute Value of Change in Current at First and Second Time Points is Equal to or Smaller than Predetermined Value>

There is a time difference between a time point at which the current detection unit 130 detects a current and a time point at which the voltage detection unit 122 detects a voltage. This time difference does not cause any problem when a change over time in the current I(t) is small. However, an error resulting the fact that a combination of the current I(t) included in Vo (=I·R) in Equation (1) and the voltage V(t) handled as the CCV shifts far away from original values (this error will be referred to as an I-V simultaneity error) occurs when the change over time in the current I(t) is large. Therefore, the calculation accuracy of ΔSOC in the SOC difference calculation unit 155 deteriorates and the accuracy of the storage capacity Qmax deteriorates. In this rule, the time point setting unit 153 sets a combination in which an absolute value of a change in the current at first and second time points is equal to or smaller than a predetermined value. In this way, it is possible to select time points at which a change over time in the current I(t) is small, and the I-V simultaneity error decreases and the accuracy of the storage capacity Qmax is improved.

<Rule 5: Set Combination in which Absolute Value of Current at First Time Point and Absolute Value of Current at Second Time Point are Equal to or Smaller than Predetermined Value>

When the current of the unit cell 111 is large, an error (that is, an IR error) in the product between the current I(t) and the battery internal resistance Ro increases. By selecting first and second time points at which the absolute value of the current at the first time point and the absolute value of the current at the second time point are equal to or smaller than a predetermined value, it is possible to decrease the IR error, and as a result, to decrease the error included in ΔSOC. In this rule, the time point setting unit 153 sets a combination in which the absolute value of the current flowing through the unit cell 111 at the first time point and the absolute value of the current flowing through the unit cell 111 at the second time point are equal to or smaller than a predetermined value.

<Rule 6: Set Combination in which Time Period Between First and Second Time Points is Equal to or Smaller than Predetermined Value>

As illustrated in Equation (3), in order to obtain the storage capacity, it is necessary to integrate the current I(t) in a time period between first and second time points to calculate a cumulative current amount ∫I(t)dt. When the integration period of the cumulative current amount ∫I(t)dt (that is, the time period between the first and second time points) increases, an error (integration error) included in the cumulative current amount ∫I(t)dt resulting from the error included in the current I(t) increases. By setting the time period between the first and second time points to a predetermined value, it is possible to suppress an increase in the integration error. In this rule, the time point setting unit 153 sets a combination in which a time period between the first and second time points is equal to or smaller than a predetermined value.

The time point setting unit 153 outputs information on the set time points to the cumulative current amount calculation unit 154 and the SOC difference calculation unit 155.

The cumulative current amount calculation unit 154 calculates the cumulative current amount ∫I(t)dt which is a time integrated value of the current I(t) in a time period determined on the basis of the combination of time points set by the time point setting unit 153. The lower end of the integration ∫I(t)dt is the first time point and the upper end is the second time point. The cumulative current amount calculation unit 154 outputs the calculated cumulative current amount ∫I(t)dt to the storage capacity calculation unit 156.

The SOC difference calculation unit 155 determines combinations of the plurality of collected time points and calculates ΔSOC on the basis of Equation (2) for each combination.

$$\Delta SOC = f(OCVb) - f(OCVa) \qquad (2)$$

The SOC difference calculation unit 155 outputs ΔSOC which is a difference between a pair of SOCs at a pair of combined time points to the storage capacity calculation unit 156.

Here, OCVa is the OCV at the first time point and OCVb is the OCV at the second time point. The second time point is a time point later than the first time point. The function f indicates the relation between OCV and SOC and is input to and stored in the storage unit 180 in advance. The SOC difference calculation unit 155 obtains the function f by communicating with the storage unit 180. Since the function f also depends on temperature, in order to obtain more accurate ΔSOC, the SOC difference calculation unit 155 may obtain temperature information of the unit cell 111 from the unit cell control units 121a and 121b to correct the function f and apply the function to Equation (2).

The accuracy of ΔSOC obtained in the present embodiment will be described. In the following description, the CCV at the first time point is defined as CCVa, the dV at the first time point is defined as dVa, the CCV at the second time point is defined as CCVb, and the dV at the second time point is defined as dVb.

If each term in OCV=CCV=I·R=Vp which is an equivalent circuit equation of a battery includes an error err, the following equations are obtained.

$$OCVa = CCVa + Verr - (Ia + Ia\_err) \cdot (Ra + Ra\_err) - (Vpa + Vpa\_err) \quad \text{First time point:}$$

$$OCVb = CCVb + Verr - (Ib + Ib\_err) \cdot (Rb + Rb\_err) - (Vpb + Vpb\_err) \quad \text{Second time point:}$$

The first and second time points are "two points at which the differences between CCV and OCV are substantially equal". If the difference between CCV and OCV is defined as dVa=dVb=X, the following equations are obtained.

First time point: $dVa = CCVa - OCVa =$
$$Verr + (Ia + Ia\_err) \cdot (Ra + Ra\_err) + (Vpa + Vpa\_err) = X$$

Second time point: $dVb = CCVb - OCVb =$
$$Verr + (Ib + Ib\_err) \cdot (Rb + Rb\_err) + (Vpb + Vpb\_err) = X$$

$$\therefore OCVa = CCVa - dVa = CCVa - X$$
$$OCVb = CCVb - dVb = CCVb - X$$
$$\Delta SOC = f(OCVb) - f(OCVa)$$
$$= f(CCVb - X) - f(CCVa - X)$$

If the function f can be approximated to a linear function represented by f(y)=Ay+B, the following equation is obtained.

$$\Delta SOC \approx A(CCVb - X) - A(CCVa - X) = A(CCVb - CCVa)$$

Therefore, an error component is cancelled, and highly accurate ΔSOC is obtained.

The storage capacity calculation unit 156 calculates the storage capacity Qmax on the basis of equation (3)

$$Q\max = \int I(t)dt / \Delta SOC \quad (3)$$

with respect to the combination of time points set by the time point setting unit 153.

The storage capacity calculation unit 156 outputs the storage capacity Qmax to the SOHQ calculation unit 157 and the vehicle system control unit 200.

The SOHQ calculation unit 157 calculates a capacity maintenance rate SOHQ on the basis of the storage capacity Qmax obtained from the storage capacity calculation unit 156 and an initial storage capacity Qmax_i obtained by communicating with the storage unit 180 according to Equation (4).

$$SOHQ = 100 \times Q\max / Q\max\_i \quad (4)$$

The SOHQ calculation unit 157 outputs the capacity maintenance rate SOHQ to the vehicle system control unit 200.

Figure 8:
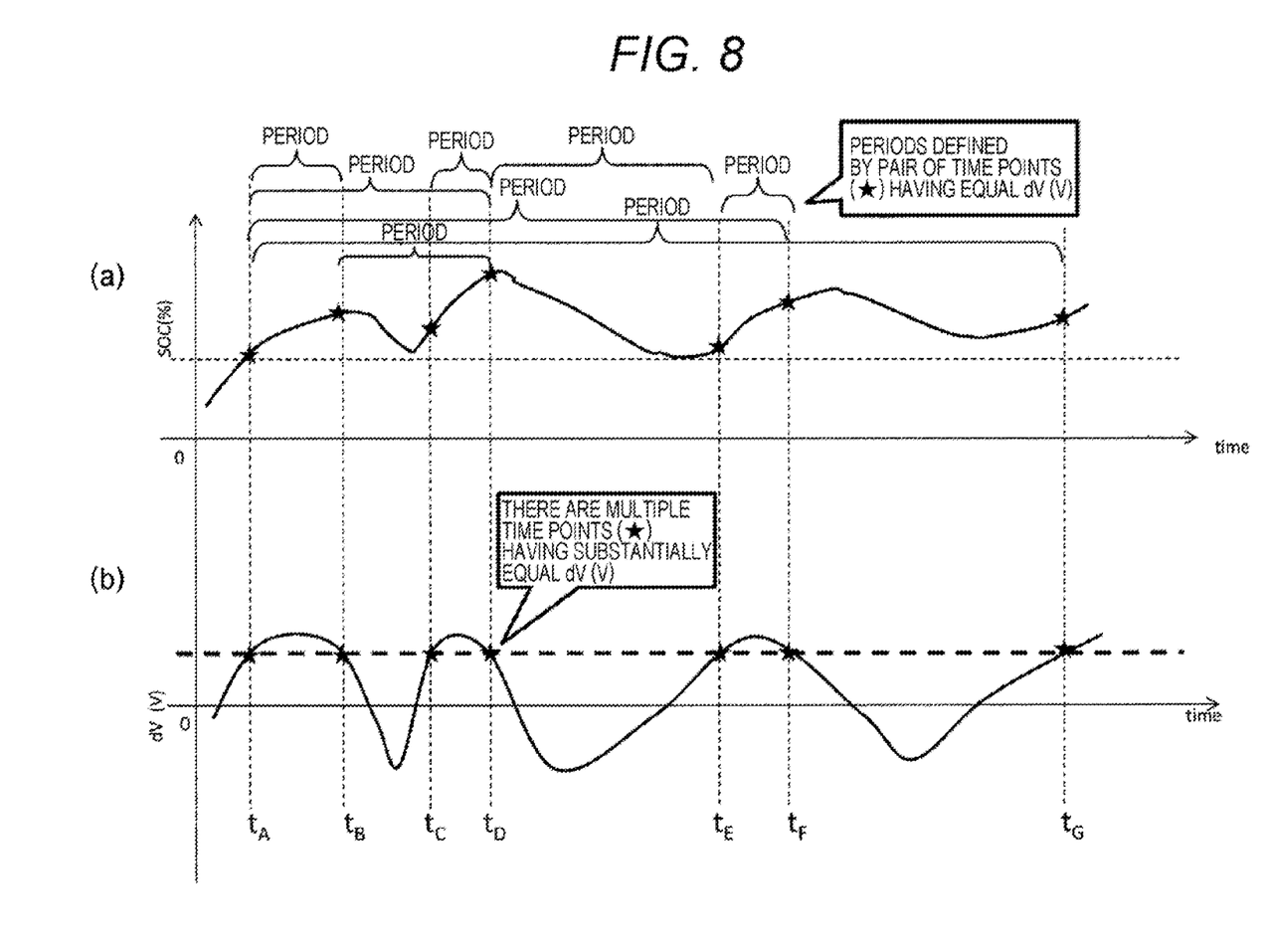
FIGS. 8(a) and 8(b) are diagrams illustrating SOC and a difference dV between CCV and OCV.

FIGS. 8(a) and 8(b) are diagrams illustrating candidate time points to be set by the time point setting unit 153. FIG. 8(a) illustrates a change over time in SOC of the unit cell 111. FIG. 8(b) illustrates a change over time in a voltage difference dV (that is, voltage difference CCV−OCV). The time point setting unit 153 selects time points at which the voltage differences dV have substantially equal values according to Rule 1. In FIG. 8(b), time points $t_A$ to $t_G$ correspond to such time points and are selected. In FIG. 8(b), star marks are added to dV at time points $t_A$ to $t_G$. In FIG. 8(a), star marks are added to SOC at time points $t_A$ to $t_G$. FIG. 8(a) illustrates various periods which are combinations which use the time points $t_A$ to $t_G$. Among these periods, a period which is a combination of time points corresponding to Rules 2 to 6 may be set. For example, according to Rule 2, a period between time points to and $t_E$ at which the absolute value of ΔSOC is large is selected.

Although it is necessary to detect an open-circuit voltage in order to detect capacity deterioration accurately, the invention disclosed in PTL 1 can obtain an open-circuit voltage at two time points only including an ignition-ON point and an ignition-OFF point. Moreover, in an invention in which a detection value of a terminal-to-terminal voltage of a battery is used as OCV, since the battery mounted on a travelling vehicle is generally repeatedly charged and discharged, it is highly likely that it is not possible to select a time point at which the voltage difference dV is within a predetermined value range.

In an embodiment of the battery controller of the present invention, capacity deterioration is detected using a method of selecting time points at which a closed-circuit voltage and an open-circuit voltage are substantially equal and estimating the open-circuit voltage on the basis of the closed-circuit voltage. In the example of FIG. 8(b), it is possible to obtain eight time points $t_A$ to $t_G$ at which the closed-circuit voltage and the open-circuit voltage are substantially equal. Moreover, by obtaining many time points, it is possible to obtain many combinations of time points. Since many combinations of time points are obtained, there are a number of chances to obtain the storage capacity Qmax and the capacity maintenance rate SOHQ.

The battery controller of the present embodiment has the following configuration and provides the following effects.

(1) The battery controller 120 includes the time point setting unit 153 that calculates the voltage difference dV at a plurality of time points, the voltage difference being obtained by subtracting the open-circuit voltage OCV obtained by calculation from the measured closed-circuit voltage CCV and sets first and second time points at which the absolute value of the voltage difference dV is equal to or smaller than a predetermined value. This condition corresponds to Rule 1. The battery controller 120 further includes the cumulative current amount calculation unit 154 that calculates the cumulative current amount ∫I(t) which is the time integrated value of a current flowing through the unit cell 111 in a period between the first and second time points, the SOC difference calculation unit 155 that calculates a difference ΔSOC between the SOC at the first time point and the SOC at the second time point, and the storage capacity calculation unit 156 that calculate a storage capacity of the unit cell 111 by dividing the cumulative current amount ∫I(t) by the SOC difference ΔSOC.

For example, the difference obtained by subtracting the first open-circuit voltage OCVa from the first closed-circuit voltage CCVa at the first time point is defined as the first voltage difference dVa (=CCVa−OCVa). The difference obtained by subtracting the second open-circuit voltage OCVb from the second closed-circuit voltage CCVb at the second time point is defined as the second voltage difference dVb (=CCVb−OCVb). When the absolute value of the difference between the first voltage difference dVa and the second voltage difference dVb is equal to or smaller than a predetermined value, the first and second time points are selected.

Since the first and second time points are selected in this manner, it is possible to obtain a large number of chances for obtaining the storage capacity Qmax and the capacity maintenance rate SOHQ. Moreover, since the first and second time points are "two points at which the differences between CCV and OCV are substantially equal," it is possible to improve the accuracy of ΔSOC.

(2) The time point setting unit 153 may calculate the voltage difference dV obtained by subtracting the open-circuit voltage OCV from the closed-circuit voltage CCV at a plurality of time points, calculate the SOC on the basis of the open-circuit voltage CCV, and set the first and second time points at which the absolute value of the voltage difference dV is equal to or smaller than a predetermined value and the absolute value of the SOC difference ΔSOC is equal to or larger than a predetermined value. That is, the absolute value of the SOC difference ΔSOC is preferably equal to or larger than a predetermined value (Rule 1+Rule 2).

In this way, it is possible to improve the SN ratio of ΔSOC and to improve the accuracy of ΔSOC. As a result, it is possible to improve the accuracy of the storage capacity Qmax.

(3) The time point setting unit 153 may calculate the voltage difference dV obtained by subtracting the open-circuit voltage OCV from the closed-circuit voltage CCV at a plurality of time points, calculate a current I(t) flowing through the secondary battery, and set the first and second time points at which the absolute value of the voltage difference dV is equal to or smaller than a predetermined value and the absolute value of the difference obtained by subtracting the current values I(t) is equal to or smaller than a predetermined value (Rule 1+Rule 3).

In this way, even when the output of the OCV calculation unit 151 includes an error, it is possible to reduce an error when the SOC difference calculation unit 155 calculates ΔSOC.

(4) The time point setting unit 153 may calculate the voltage difference dV obtained by subtracting the open-circuit voltage OCV from the closed-circuit voltage CCV at a plurality of time points, calculate an absolute value of a change over time in the current I(t) flowing through the secondary battery, and set the first and second time points at which the absolute value of the voltage difference dV is equal to or smaller than a predetermined value and the absolute value of the change over time in the current I(t) flowing through the secondary battery is equal to or smaller than a predetermined value (Rule 1+Rule 4).

In this way, it is possible to obviate a problem that a current value shifts far away from an original current value, resulting from a difference in detection time point of the current detection unit 130 and the voltage detection unit 122.

(5) The time point setting unit 153 may calculate the voltage difference dV obtained by subtracting the open-circuit voltage OCV from the closed-circuit voltage CCV at a plurality of time points, calculate an absolute value of the current I(t) flowing through the secondary battery, and set the first and second time points at which the absolute value of the voltage difference is equal to or smaller than a predetermined value and the absolute value of the current I(t) flowing through the secondary battery is equal to or smaller than a predetermined value (Rule 1+Rule 5).

In this way, since time points at which small current flows through the unit cell 111 are selected, it is possible to reduce an IR error and to reduce an error included in ΔSOC.

(6) The time point setting unit 153 may calculate the voltage difference dV obtained by subtracting the open-circuit voltage OCV from the closed-circuit voltage CCV at a plurality of time points, calculate an absolute value of the current I(t) flowing through the secondary battery, and set the first and second time points at which the absolute value of the voltage difference dV is equal to or smaller than a predetermined value and the time period is equal to or smaller than a predetermined value (Rule 1+Rule 6).

In this way, it is possible to suppress an increase in an error (integration error) included in the cumulative current amount ∫I(t)dt resulting from an error included in the current I(t) flowing through the unit cell 111.

Second Embodiment

In the present embodiment, the vehicle system control unit 200 can communicate with the time point setting unit 153 of the battery pack control unit 150. The description of the same constituent elements as those of the first embodiment will be omitted.

In the present embodiment, the vehicle system control unit 200 illustrated in FIG. 1 performs control to increase a variation over time in the SOC of the unit cell 111 by actively charging or discharging the SOC of the unit cells 111 that form the battery pack 110 in a predetermined period after the vehicle system 500 is started. The specific control will be described later.

Here, offset calibration will be described. The current detection unit 130 corrects a current value by subtracting an error (that is, an offset error) included in a detection value of the current detection unit 130 from the detection value and outputs the corrected current value.

This offset error is a detection value of the current detected by the current detection unit 130 in a state in which no current flows through the unit cell 111. Since the offset error varies with time, it is preferable to use the latest one as much as possible. Updating the offset error is offset calibration. Moreover, since the offset error varies with time, the output value of the current detection unit 130 is closer to the true value as the detection time point approaches an offset calibration time point after previous offset calibration is performed. That is, the accuracy of the storage capacity Qmax is improved.

Since the relays 300 and 310 illustrated in FIG. 2 are not connected immediately after the vehicle system 500 is started, the current flowing through the battery pack 110 is zero unless the vehicle system 500 is connected to the charger 420. Offset calibration is generally performed at this time point. Therefore, when the storage capacity Qmax is obtained in a predetermined period after the vehicle system 500 is started, it is possible to improve the accuracy of the storage capacity Qmax.

However, if the variation in the SOC of the unit cell 111 is not too large in a predetermined period after the vehicle system 500 is started, ΔSOC does not increase and the storage capacity Qmax is not obtained. Due to this, in the present embodiment, the vehicle system control unit 200 performs control to increase the variation over time in the SOC of the unit cell 111 after offset calibration is performed after the vehicle system 500 is started. Since ΔSOC increases when the variation in SOC is increased, it is possible to improve the accuracy of the storage capacity Qmax. After starting the control to increase the variation over time in the SOC of the unit cell 111, the vehicle system control unit 200 transmits a signal S2 to the time point setting unit 153 of the battery controller 120 to inform that the control to increase the variation over time in the SOC of the unit cell 111 has started. The time point setting unit 153 sets time points in a predetermined period after the vehicle system 500 is started.

In the present embodiment, the vehicle system control unit 200 performs control to increase the variation over time in the SOC of the unit cell 111 according to the following method after offset calibration is performed after the vehicle system 500 is started. Any one of Method 1 and Method 2 may be used, and alternatively, a combination thereof may be used.

<Specific Control Method 1 for Increasing SOC Variation>

When the vehicle is moving (that is, the driving system 600 is driven by the engine 710 and the motor generator 410), the vehicle system control unit 200 controls the engine controller 700 so that motive power to be distributed to the driving system 600 of the engine 710 is reduce as compared to a normal case and controls the inverter 400 so that motive power to be distributed to the driving system 600 of the motor generator 410 is increased by an amount corresponding to the reduction. Since the SOC can be reduced as compared to a normal case by increasing the motive power to be distributed to the motor generator 410 as compared to a normal case, it is possible to increase the variation in SOC.

<Specific Control Method 2 for Increasing SOC Variation>

As illustrated in FIG. 1, the motor generator 410 generates power using the motive power of the engine 710 and charges the unit cells 111 that form the battery pack 110. The vehicle system control unit 200 controls the engine controller 700 so that the motive power of the engine 710 to be supplied to the motor generator 410 is increased as compared to a normal case. In this way, since the unit cell 111 is charged more than the normal case, the SOC increases and the SOC variation increases. Conversely, the vehicle system control unit 200 controls the engine controller 700 so that the motive power of the engine 710 to be supplied to the motor generator 410 is decreased as compared to a normal case. In this way, since the unit cell 111 is charged less than the normal case, the SOC decreases and the SOC variation increases. Alternatively, the control of supplying more motive power than the normal case and the control of supplying less motive power than the normal case may be performed in combination. For example, after the control of supplying more motive power than the normal case is performed for a predetermined period, the control of supplying less motive power than the normal case may be performed for a predetermined period. In this way, since SOC can be decreased more than the normal case after SOC is increased more than the normal case, it is possible to increase the variation in SOC.

Modification of Second Embodiment

In the second embodiment, although the vehicle system control unit 200 actively controls the respective constituent elements in a predetermined period after the vehicle system 500 is started, another embodiment may be used. For example, the time point setting unit 153 of the battery controller 120 may detect the start-up of the vehicle system 500 by communicating with the vehicle system control unit 200 and may issue a command (the signal S5 in FIG. 1) to the vehicle system control unit 200 so that control to increase the variation over time in the SOC of the unit cell 111 is performed.

Third Embodiment

In the present embodiment, the vehicle system control unit 200 communicates with the time point setting unit 153 of the battery pack control unit 150. The description of the same constituent elements as those of the first embodiment will be omitted.

Upon receiving a command to measure the capacitance of the unit cells 111 that form the battery pack 110 from an external capacitance measurement device, the vehicle system control unit 200 performs control to increase the variation over time in the SOC of the unit cell 111 by actively charging or discharging the SOC of the unit cells 111 that form the battery pack 110.

Traders such as car dealers who conduct vehicle maintenance often examine a storage capacity of the unit cells 111 that form the battery pack 110 using a capacitance measurement device to examine whether capacity deterioration occurs. Upon receiving a capacitance measurement command from such a capacitance measurement device, the vehicle system control unit 200 performs control to increase the variation over time in the SOC of the unit cell 111 in order to provide high-accuracy storage capacity and SOHQ.

A specific method is the same as that of the second embodiment, and the description thereof will be omitted. Since the driving system 600 can be driven without moving the vehicle forward or backward on rollers provided under the wheels of the vehicle, the method can be applied to an invention which cannot be implemented unless the driving system 600 is driven and can be performed in a vehicle service center or the like without any problem.

Modification of Third Embodiment

In the third embodiment, although the vehicle system control unit 200 actively controls respective constituent elements when the vehicle system control unit 200 receives a command to measure the capacitance of the unit cells 111 that form the battery pack 110 from an external capacitance measurement device, another embodiment may be used. For example, the time point setting unit 153 of the battery controller 120 may detect a capacitance measurement command by communicating with the vehicle system control unit 200 and may issue a command (the signal S5 in FIG. 1) to the vehicle system control unit 200 so that control to increase the variation over time in the SOC of the unit cell 111 is performed.

The storage capacity calculation unit 156 may average a plurality of storage capacities Qmax to output the average storage capacity Qmax. Furthermore, when the average of the plurality of storage capacities Qmax is weight-averaged according to an error (that is, when the storage capacities are weight-averaged so that the smaller the error, the more the storage capacity is applied), it is possible to improve the accuracy further.

The present invention is not limited to the content described hereinabove. Other embodiments conceived within the scope of the technical idea of the present invention also fall within the scope of the present invention.

REFERENCE SIGNS LIST 100 battery system
110 battery pack
111 unit cell
112a, 112b unit cell group
120 battery controller
121a, 121b unit cell control unit
122 voltage detection unit
123 control circuit
124 signal input/output circuit
125 temperature detection unit
130 current detection unit
140 voltage detection unit
150 battery pack control unit
151 OCV calculation unit
152 voltage difference calculation unit
153 time point setting unit
154 cumulative current amount calculation unit
155 SOC difference calculation unit
156 storage capacity calculation unit
157 SOHQ calculation unit
160 signal communication line
170 insulation element
180 storage unit
200 vehicle system control unit
250 input unit
300, 310, 320, 330 relay
400 inverter
410 motor generator
420 charger
600 driving system
700 engine controller
710 engine

The invention claimed is:

1. A battery controller comprising:
a closed-circuit voltage detection unit that measures a terminal-to-terminal voltage of a secondary battery to acquire a closed-circuit voltage;
an open-circuit voltage calculation unit that performs calculation on the basis of the closed-circuit voltage to acquire an open-circuit voltage;
a time point setting unit that calculates a voltage difference obtained by subtracting the open-circuit voltage from the closed-circuit voltage and sets a first time point and a second time point at which an absolute value of the voltage difference is equal to or smaller than a predetermined value;
a cumulative current amount calculation unit that obtains a cumulative current amount which is a time integrated value of a current flowing through the secondary battery in a period between the first time point and the second time point;
a SOC difference calculation unit that calculates a difference between SOC at the first time point and SOC at the second time point; and
a storage capacity calculation unit that divides the cumulative current amount by the SOC difference to calculate a storage capacity of the secondary battery.

2. The battery controller according to claim 1, wherein the time point setting unit calculates the SOC on the basis of the open-circuit voltage and sets the first and second time points at which an absolute value of the SOC difference is equal to or larger than a predetermined value.

3. The battery controller according to claim 1, wherein the time point setting unit calculates a current flowing through the secondary battery and sets the first and second time points at which an absolute value of a difference obtained by subtracting the current values is equal to or smaller than a predetermined value.

4. The battery controller according to claim 1, wherein the time point setting unit calculates an absolute value of a change over time in the current flowing through the secondary battery and sets the first and second time points at which an absolute value of a change over time in the current flowing through the secondary battery is equal to or smaller than a predetermined value.

5. The battery controller according to claim 1, wherein the time point setting unit calculates an absolute value of a current flowing through the secondary battery and sets the first and second time points at which an absolute value of the current flowing through the secondary battery is equal to or smaller than a predetermined value.

6. The battery controller according to claim 1, wherein the time point setting unit sets the first and second time points at which a time period is equal to or smaller than a predetermined value.

7. The battery controller according to claim 1, wherein the battery controller is mounted on a vehicle system on which a motor generator that is driven by electric power from the secondary battery in a powering mode and generates regenerative power that charges the secondary battery in a regeneration mode and a system control unit that controls the motor generator are mounted.

8. The battery controller according to claim 7, further comprising:
a command unit that calculates a period elapsed from a time point at which the vehicle system is started and issues a command to perform control of increasing a variation in the SOC to the system control unit when the elapsed period exceeds a predetermined value.

9. The battery controller according to claim 7, further comprising:
a command unit that issues a command to perform control of increasing a variation in the SOC to the system control unit when the system control unit receives a command to measure the capacitance of the secondary battery from an external capacitance measurement device.

10. The battery controller according to claim 8, wherein the vehicle system further has an engine controlled by the system control unit mounted thereon,
the engine and the motor generator drive a driving system, and
the system control unit performs control to increase a variation in the SOC by decreasing motive power to be distributed to the driving system of the engine and increasing motive power to be distributed to the driving system of the motor generator.

11. The battery controller according to claim 8, wherein the vehicle system further has an engine controlled by the system control unit mounted thereon, and the system control unit performs control to increase a variation in the SOC by allowing the motor generator to generate electric power using the motive power of the engine and supplying electric power to the secondary battery.

12. A vehicle system comprising:

the battery controller according to claim 1;

a motor generator that is driven by electric power from the secondary battery during a powering mode and generates regenerative power that charges the secondary battery in a regeneration mode; and a system control unit that controls at least the motor generator.

13. The vehicle system according to claim 12, wherein the system control unit calculates a period elapsed from a time point at which the vehicle system is started and performs control to increase a variation in the SOC until the elapsed period exceeds a predetermined value.

14. The vehicle system according to claim 12, wherein the system control unit performs control to increase a variation in the SOC upon receiving a command to measure the capacitance of the secondary battery from an external capacitance measurement device.

15. The vehicle system according to claim 13, further comprising:

an engine controlled by the system control unit, wherein the engine and the motor generator drive a driving system, and the system control unit performs control to increase a variation in the SOC by decreasing motive power to be distributed to the driving system of the engine and increasing motive power to be distributed to the driving system of the motor generator.

16. The vehicle system according to claim 13, further comprising:

an engine controlled by the system control unit, wherein the system control unit performs control to increase a variation in the SOC by allowing the motor generator to generate electric power using the motive power of the engine and supplying electric power to the secondary battery.

* * * * *